United States Patent
Takabayashi et al.

(10) Patent No.: US 11,984,696 B2
(45) Date of Patent: May 14, 2024

(54) OPTICAL AMPLIFIER AND INSPECTION METHOD OF OPTICAL AMPLIFIER

(71) Applicant: Fujitsu Optical Components Limited, Kawasaki (JP)

(72) Inventors: Kazumasa Takabayashi, Atsugi (JP); Suguru Akiyama, Tsukuba (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 915 days.

(21) Appl. No.: 16/990,544

(22) Filed: Aug. 11, 2020

(65) Prior Publication Data
US 2021/0091530 A1  Mar. 25, 2021

(30) Foreign Application Priority Data
Sep. 20, 2019 (JP) ................. 2019-171566

(51) Int. Cl.
*H01S 5/00* (2006.01)
*H01S 5/042* (2006.01)
*H01S 5/10* (2021.01)

(52) U.S. Cl.
CPC ........ *H01S 5/0014* (2013.01); *H01S 5/04256* (2019.08); *H01S 5/101* (2013.01)

(58) Field of Classification Search
CPC .............................. H01S 5/5018; H01S 5/5027
See application file for complete search history.

(56) References Cited

U.S. PATENT DOCUMENTS

| | | | |
|---|---|---|---|
| 4,794,346 A | 12/1988 | Miller | |
| 10,678,074 B2 * | 6/2020 | Nishikawa | ............ H01S 5/343 |
| 2014/0078580 A1 | 3/2014 | Hasegawa et al. | |
| 2019/0310496 A1 * | 10/2019 | Zilkie | ...................... H01S 5/12 |
| 2019/0317341 A1 | 10/2019 | Nishikawa | |
| 2021/0126428 A1 * | 4/2021 | Fujiwara | ............... H01S 5/3434 |

FOREIGN PATENT DOCUMENTS

| | | |
|---|---|---|
| CN | 103534885 A | 1/2014 |
| CN | 110168824 A | 8/2019 |
| JP | 2012-4441 | 1/2012 |

OTHER PUBLICATIONS

Chinese Office Action dated Dec. 21, 2023 for corresponding Chinese Application No. 202010824502.1.

* cited by examiner

*Primary Examiner* — Eric L Bolda
(74) *Attorney, Agent, or Firm* — STAAS & HALSEY LLP (57) ABSTRACT

An optical amplifier includes an optical amplifier chip that includes a pair of semiconductor optical amplifiers (SOAs), a U-shaped waveguide connecting the pair of SOAS, and two electrodes that respectively correspond to the pair of SOAS and are separated from each other, and a base substrate that includes a common metal wiring connecting the two electrodes, and on which the optical amplifier chip is mounted.

5 Claims, 8 Drawing Sheets

TO MEASURING INSTRUMENT

TO MEASURING INSTRUMENT

OPTICAL AMPLIFIER AND INSPECTION METHOD OF OPTICAL AMPLIFIER

CROSS-REFERENCE TO RELATED APPLICATION

This application is based upon and claims the benefit of priority of the prior Japanese Patent Application No. 2019-171566, filed on Sep. 20, 2019, the entire contents of which are incorporated herein by reference.

FIELD

The embodiment discussed herein is related to an optical amplifier and an inspection method of an optical amplifier.

BACKGROUND

Generally, a high transmission optical output and a high sensitivity are demanded of optical communication devices used in an optical communication system. To satisfy these demands, there is a method of amplifying a transmission light and a reception light by using an optical amplifier. When an optical amplifier is used, a semiconductor optical amplifier (SOA), a chip size of which is small can be used in the viewpoint of downsizing of the optical communication device.

Figure 7:
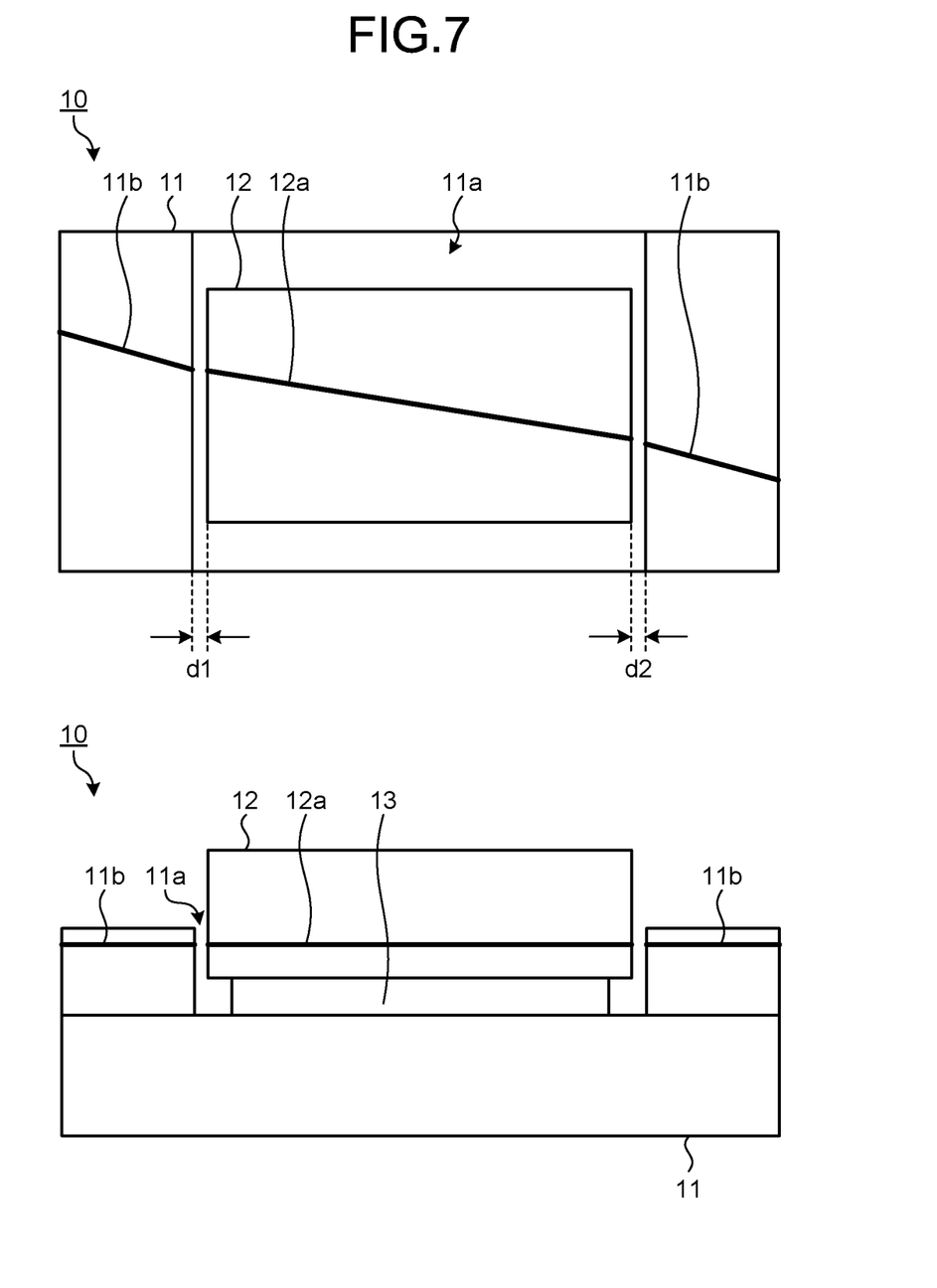
FIG. 7 illustrates a structure example of an optical amplifier.

FIG. 7 illustrates a structure example of an optical amplifier 10 that uses an SOA chip. An upper diagram in FIG. 7 is a plan view of the optical amplifier 10, and a lower diagram in FIG. 7 is a side view of the optical amplifier 10. As illustrated in FIG. 7, a base substrate 11 has a concave-shaped terrace portion 11a formed therein, and on the terrace portion 11a, an SOA chip 12 is arranged. The SOA chip 12 is positioned such that an end surface of a waveguide 11b formed in the base substrate 11 and an end surface of a core layer 12a of the SOA chip 12 oppose to each other and optically coupled, and is fixed to the terrace portion 11a by a bump 13.

The terrace portion 11a has a width enabled to arrange the SOA chip 12 having a maximum chip length, considering variations in chip length of the SOA chip 12. Therefore, when the SOA chip 12 is arranged on the terrace portion 11a, gaps having widths d1, d2 can be formed between end surfaces of the waveguide 11b and end surfaces of the core layer 12a, respectively. When the widths d1, d2 become large, optical coupling losses in these gaps increase, and the amplification properties of the optical amplifier 10 are deteriorated.

Figure 8:
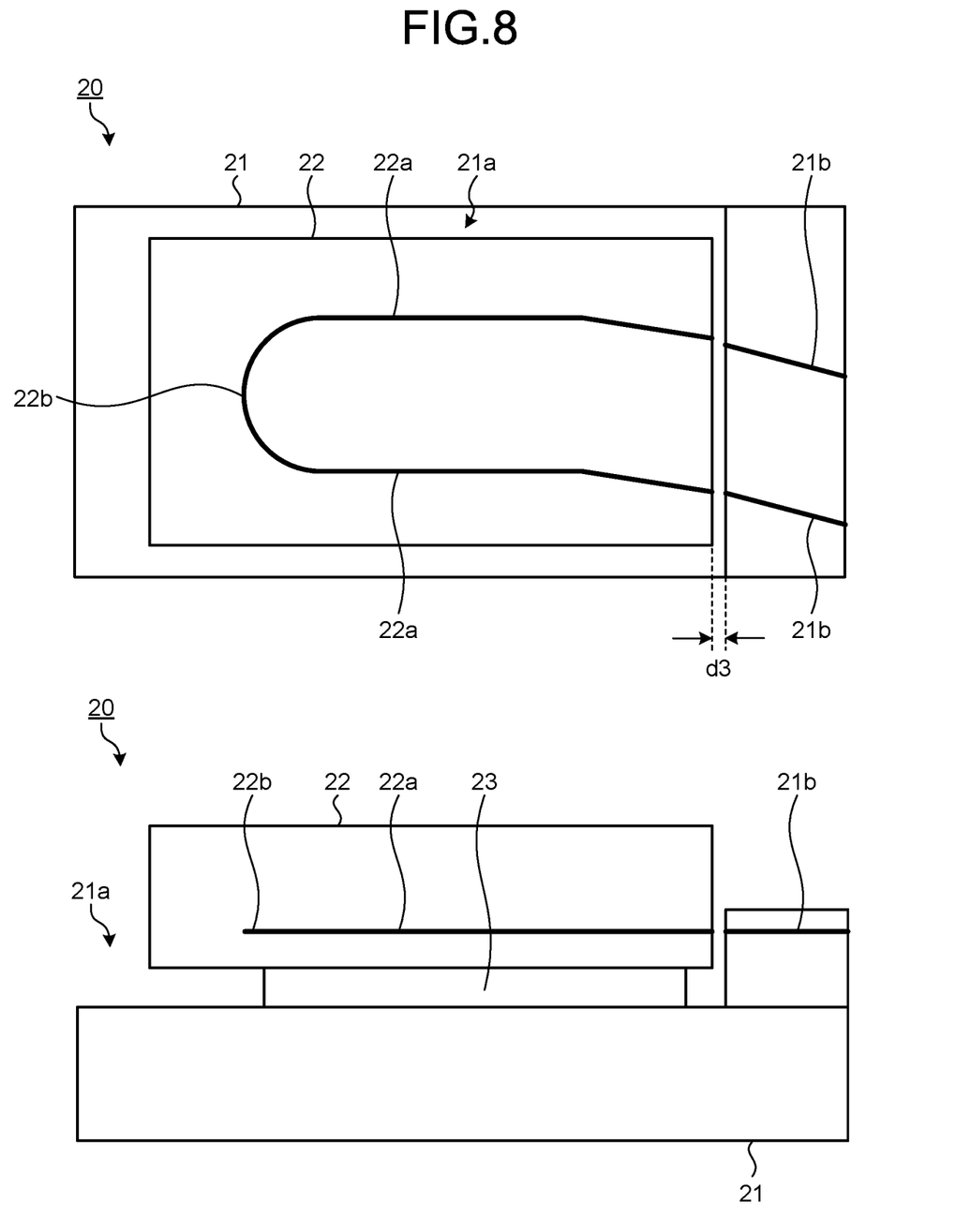
FIG. 8 illustrates another structure example of an optical amplifier.

To cope with this problem, for example, as illustrated in FIG. 8, an optical amplifier 20 in which a U-turn type SOA chip is used has been developed. FIG. 8 illustrates a structure of the optical amplifier 20 in which a U-turn type SOA chip is used. An upper diagram in FIG. 8 is a plan view of the optical amplifier 20, and a lower diagram in FIG. 8 is a side view of the optical amplifier 20.

As illustrated in FIG. 8, a base substrate 21 has a concave-shaped terrace portion 21a formed therein, and an SOA chip 22 is arranged on the terrace portion 21a. In the SOA chip 22, two SOAs 22a are connected by a U-turn waveguide 22b. Therefore, end surfaces of the two SOAs 22a are exposed at the same side surface of the SOA chip 22, and an input and an output are arranged at one side surface of the SOA chip 22. The SOA chip 22 is positioned such that the end surface of the waveguide 21b formed in the base substrate 21 and the end surface of the SOA 22a of the SOA chip 22 oppose to each other, and optically coupled, and is fixed to the terrace portion 21a by a bump 23.

The U-turn waveguide 22b is a waveguide that has a high mesa structure in which a core layer is not buried in a semiconductor material, and is capable of enhancing confinement of light, and reducing a curvature radius of a turn of the waveguide. Consequently, miniaturization of the SOA chip 22 is enabled. Moreover, because the input and the output of the SOA chip 22 are arranged on the same side surface, it is possible to bring the end surfaces of the two waveguides 21b and the ends surfaces of the two SOAs 22a close to each other, to thereby make a width d3 of a gap small. As a result, an optical coupling loss can be suppressed, and the amplification properties of the optical amplifier 20 can be improved.

Patent Document 1: U.S. Pat. No. 4,794,346
Patent Document 2: Japanese Laid-open Patent Publication No. 2012-4441

It is common that before an SOA chip is mounted on a base substrate, an inspection whether the SOA chip performs optical amplification properly. Specifically, an optical fiber is brought close to one end surface of an SOA to be optically coupled therewith, and light is input to the SOA from the optical fiber. Moreover, an optical fiber is brought close to the other end surface of the SOA, to be optically coupled, and intensity of light output from the SOA is measured. The properties of the SOA are thereby evaluated.

However, in the U-turn type SOA chip described above, the end surfaces of the SOA are exposed on the same side surface and, therefore, there is a problem that the inspection and evaluation of the SOA are difficult. That is, in the SOA chip 22 illustrated in FIG. 8, the curvature radius of the U-turn waveguide 22b is small to decrease the chip size to be as small as possible, and the two SOAs 22a are arranged close to each other. Because of this, it is difficult to bring an optical fiber close to the end surfaces of the two SOAs 22a.

Specifically, the two SOAs 22a are arranged to be apart from each other by, for example, 200 μm and, accordingly, a distance between the end surfaces of the two SOAs 22a exposed on the side surface of the SOA chip 22 is also about 200 μm. On the other hand, because a diameter of general optical fibers is 250 μm, it is difficult to bring two optical fibers close to the end surfaces of the two SOA 22a exposed on the same side surface of the SOA chip 22 to be optically coupled. Furthermore, even when thin optical fibers having a diameter of, for example, 125 μm are used, it is not easy to hold the two optical fibers, positioned at the end surfaces of the two SOAs 22a closely adjacent to each other, and the efficiency of property evaluation of the SOA chip 22 is reduced.

SUMMARY

According to an aspect of an embodiment, an optical amplifier includes an optical amplifier chip that includes a pair of semiconductor optical amplifiers (SOAs), a U-shaped waveguide connecting the pair of SOAs, and two electrodes that respectively correspond to the pair of SOAs and are separated from each other, and a base substrate that includes a common metal wiring connecting the two electrodes, and on which the optical amplifier chip is mounted.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The embodiment is not intended to limit the present invention.

Figure 1:
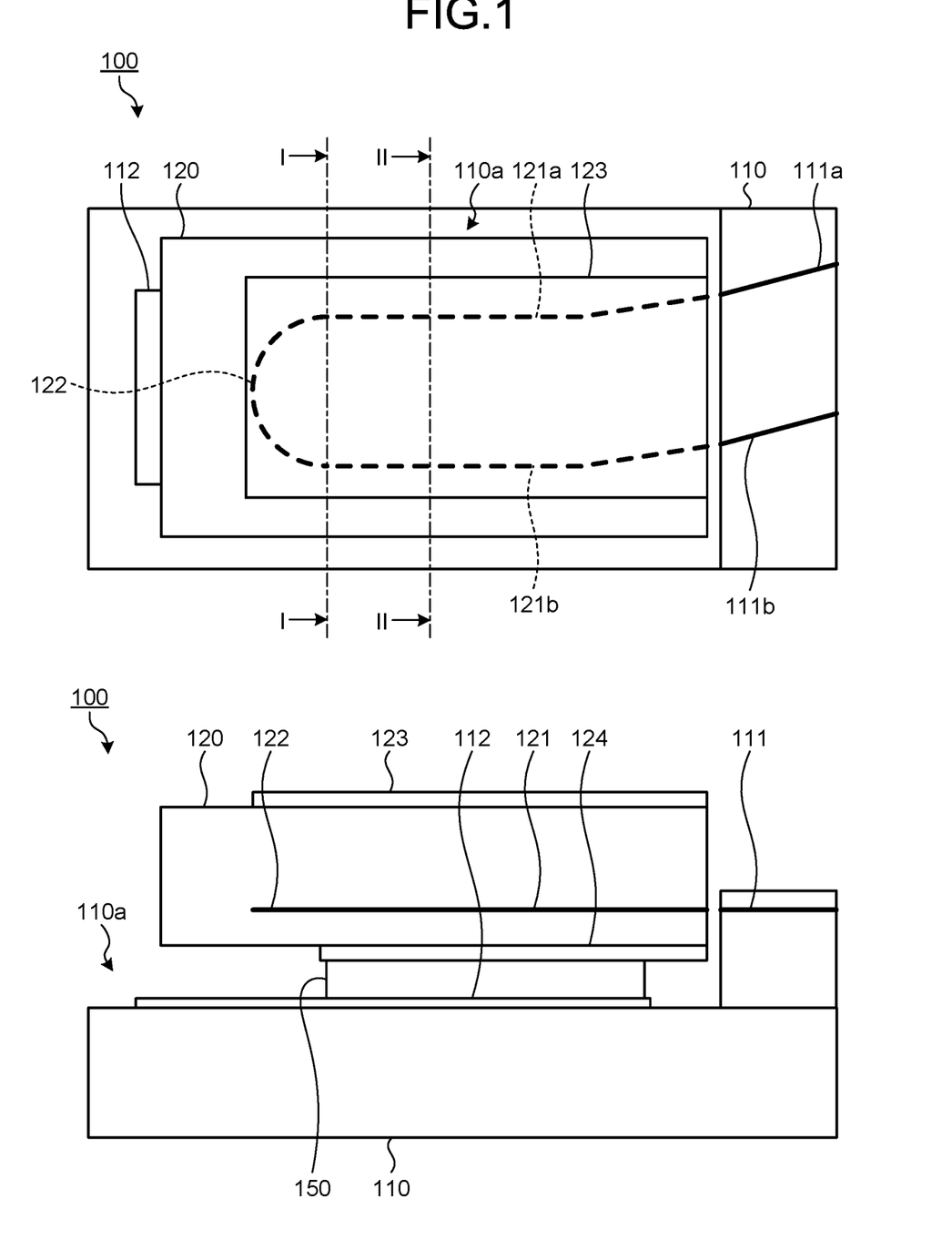
FIG. 1 illustrates a structure of an optical amplifier according to one embodiment.

FIG. 1 illustrates a structure of an optical amplifier 100 according to one embodiment. An upper diagram in FIG. 1 is a plan view of the optical amplifier 100, and a lower diagram in FIG. 1 is a side view of the optical amplifier 100.

The optical amplifier 100 has a structure in which an optical amplifier chip 120 is mounted on a base substrate 110. That is, on the base substrate 110, a concave-shaped terrace portion 110a is formed, and the optical amplifier chip 120 is arranged on the terrace portion 110a.

The base substrate 110 is formed using a material, such as silicon and silicon dioxide ($SiO_2$), and has a waveguides 111a, 111b that input and output light with respect to the optical amplifier chip 120. On a bottom surface of the terrace portion 110a of the base substrate 110, a metal wiring 112 is formed, and the optical amplifier chip 120 is connected and fixed thereto by a bump 150 formed on the metal wiring 112. It is not illustrated in FIG. 1, but the other ends (end portions in a rightward direction in the diagram) of the waveguides 111a, 111b not connected to the optical amplifier chip 120 may be connected to other optical parts, such as an optical modulator and an optical fiber.

The optical amplifier chip 120 is formed using a compound semiconductor material, and has two SOAs 121a, 121b, and a U-turn waveguide 122 that connects them. In FIG. 1, an SOA active layer is illustrated as SOA 121, 121a, 121b, and a U-turn waveguide core layer is illustrated as the U-turn waveguide 122. For this, in the following, they can be denoted as "SOA active layers 121a, 121b" and "U-turn-waveguide core layer 122". End surfaces of the two SOAs 121a, 121b are exposed from the same side surface of the optical amplifier chip 120, and oppose to end surfaces of the waveguides 111a, 111b formed in the base substrate 110 to be optically coupled therewith. On a surface of the optical amplifier chip 120 opposed to the base substrate 110 (hereinafter, "upper surface"), a common cathode electrode 123 that covers the SOAs 121a, 121b and the U-turn waveguide 122 is arranged. Moreover, as described later, on a surface of the optical amplifier chip 120 on a side of the base substrate 110 (hereinafter, "lower surface"), two independent anode electrodes 124 corresponding respectively to the SOAs 121a, 121b are arranged. The two anode electrodes 124 are electrically connected to a single piece of the metal wiring 112 through the bumps 150, respectively.

Figure 2:
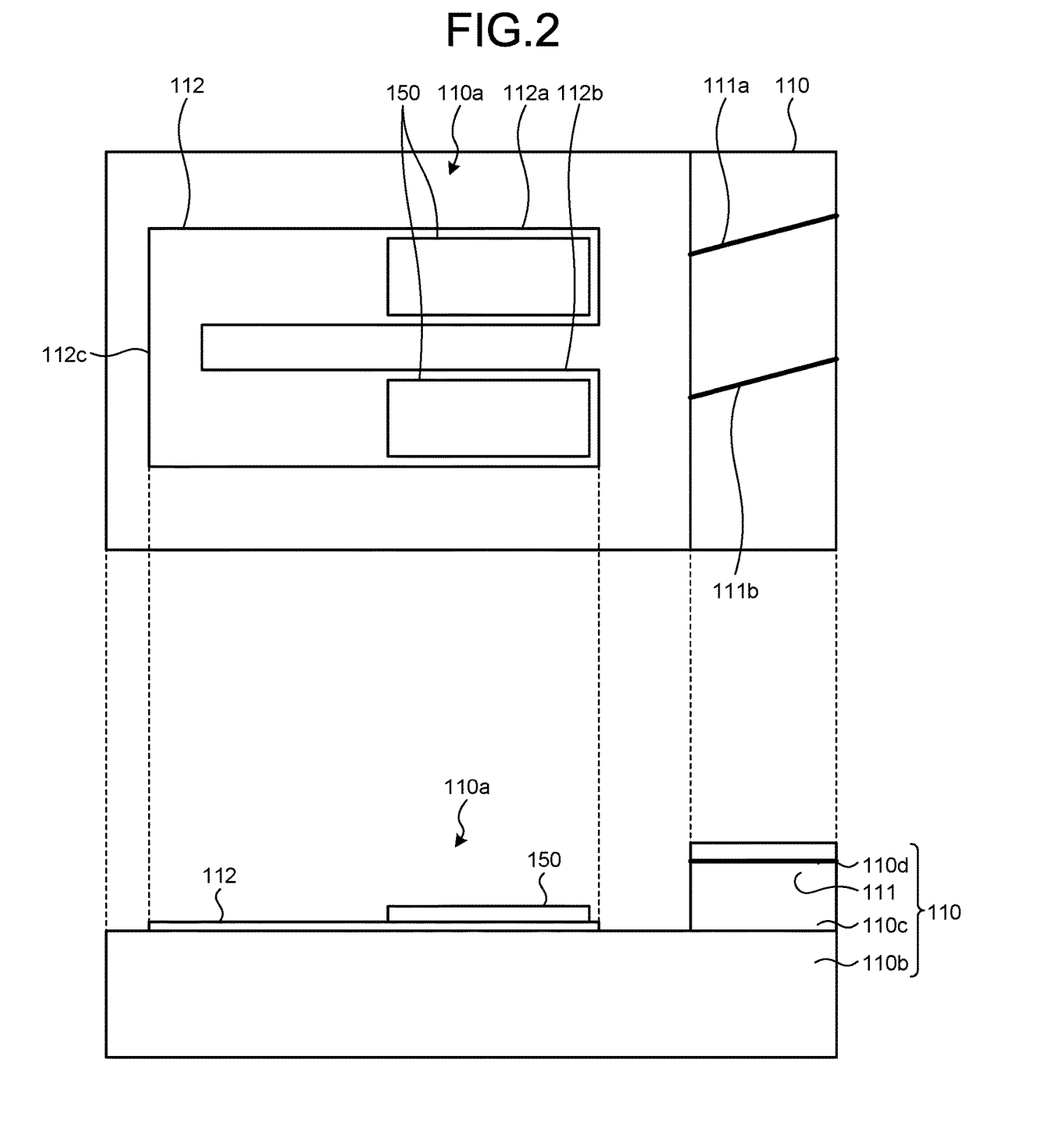
FIG. 2 illustrates a structure of a base substrate.

FIG. 2 illustrates a structure of the base substrate 110. An upper diagram in FIG. 2 is a plan view of the base substrate 110, and a lower diagram in FIG. 2 is a side view of the base substrate 110.

The base substrate 110 is structured, for example, such that a silicon thin waveguide is formed on a silicon-on-insulator (SOI) substrate. That is, as illustrated in FIG. 2, the base substrate 110 has a laminated structure in which a silicon layer 110b, an insulative $SiO_2$ layer 110c, a silicon waveguide 111, and an insulative $SiO_2$ layer 110d are laminated, and by cutting out a portion above the silicon layer 110b, the terrace portion 110a is formed. On the bottom surface of the terrace portion 110a, the U-shaped metal wiring 112 that is formed with, for example, Ti/Pt/Au film is formed. Depending on sizes of the SOAs 121a, 121b mounted on the base substrate 110, the silicon layer 110b may further be cut out in the terrace portion 110a to match the height of waveguides of the SOAs 121a, 121b and the height of the waveguides 111a, 111b.

Two parallel portions 112a, 112b that form the U-shaped metal wiring 112 and that are parallel to each other has the bump 150 made using, for example, AuSn (gold tin) as a material formed thereon, and are connected to the anode electrodes 124 on a lower surface of the optical amplifier chip 120 through the respective bumps 150. The parallel portions 112a, 112b are connected by a connecting portion 112c, and the metal wiring 112 forms a single piece of the U-shaped metal wiring as a whole. When the optical amplifier chip 120 is mounted on the base substrate 110, a part of the connecting portion 112c is exposed without being covered by the optical amplifier chip 120, and enables external wirings to be connected to this exposed portion. Consequently, it is possible to apply a common voltage through this connecting portion 112c to the parallel portions 112a, 112b that are connected to the respective different anode electrodes 124, and to thereby simplify the control of the optical amplifier chip 120.

Figure 3:
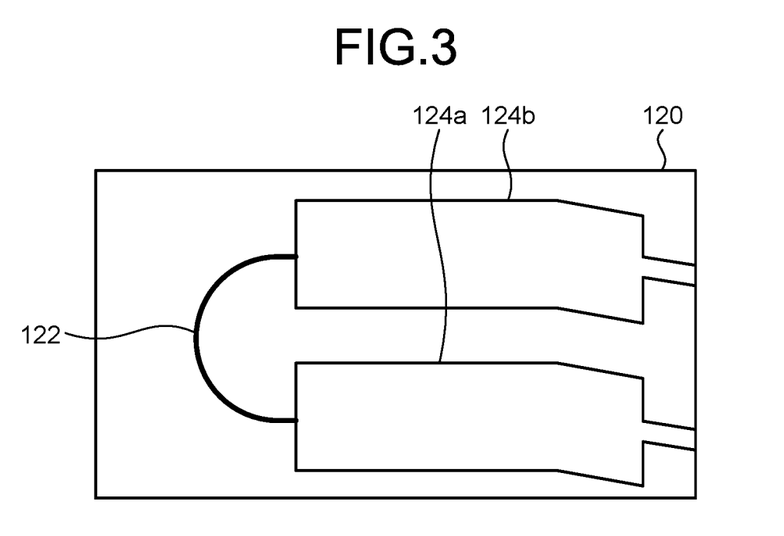
FIG. 3 illustrates a structure of an optical amplifier chip.

FIG. 3 illustrates a structure of the lower surface of the optical amplifier chip 120. Specifically, the lower surface illustrated in FIG. 3 opposes to the bottom surface of the terrace portion 110a of the base substrate 110. As illustrated in FIG. 3, at positions corresponding to the SOAs 121a, 121b, anode electrodes 124a, 124b are arranged, respectively. The anode electrodes 124a, 124b are electrically separated, and are independent from each other. Moreover, the anode electrodes 124a, 124b are arranged at positions covering the respective SOAs 121a, 121b, not covering the U-turn waveguide 122.

As described, because the anode electrodes 124a, 124b are independent from each other, it is possible to apply a voltage separately to the SOAs 121a, 121b before the optical amplifier chip 120 is mounted on the base substrate 110. Therefore, the inspection to evaluate the SOAs 121a, 121b can be performed efficiently before the optical amplifier chip 120 is mounted on the base substrate 110. By performing the inspection of the optical amplifier chip 120 before mounting on the base substrate 110, the optical amplification properties of the optical amplifier 100 having a structure in which the optical amplifier chip 120 is mounted on the base substrate 110 can be guaranteed. The inspection method of the SOAs 121a, 121b will be described in detail later.

When mounting the optical amplifier chip 120 on the base substrate 110, the anode electrodes 124a, 124b are connected to the metal wiring 112 of the terrace portion 110a through the bumps 150, respectively. That is, the anode electrode 124a is connected to the parallel portion 112a through the bump 150, and the anode electrode 124b is connected to the parallel portion 112b through the bump 150. Therefore, after the optical amplifier chip 120 is mounted on the base substrate 110, the anode electrodes 124a, 124b become electrically shorted by the metal wiring 112, to form one continuous electrode. Therefore, after the optical amplifier chip 120 is mounted on the base substrate 110, the SOAs 121a, 121b can be driven by using a common power source, and it is possible to simplify the control of the optical amplifier chip 120.

Figure 4:
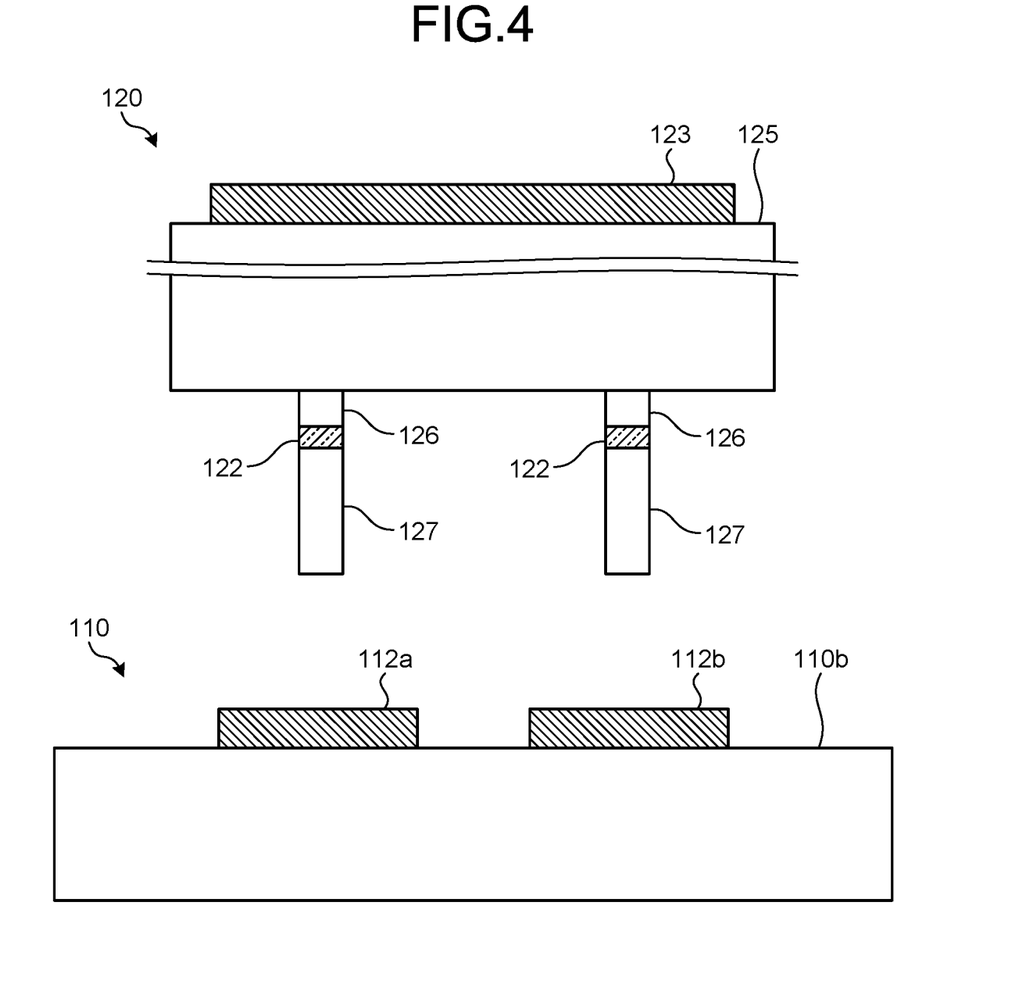
FIG. 4 is a schematic diagram illustrating a cross-section taken along a line I-I in FIG. 1.
Figure 5:
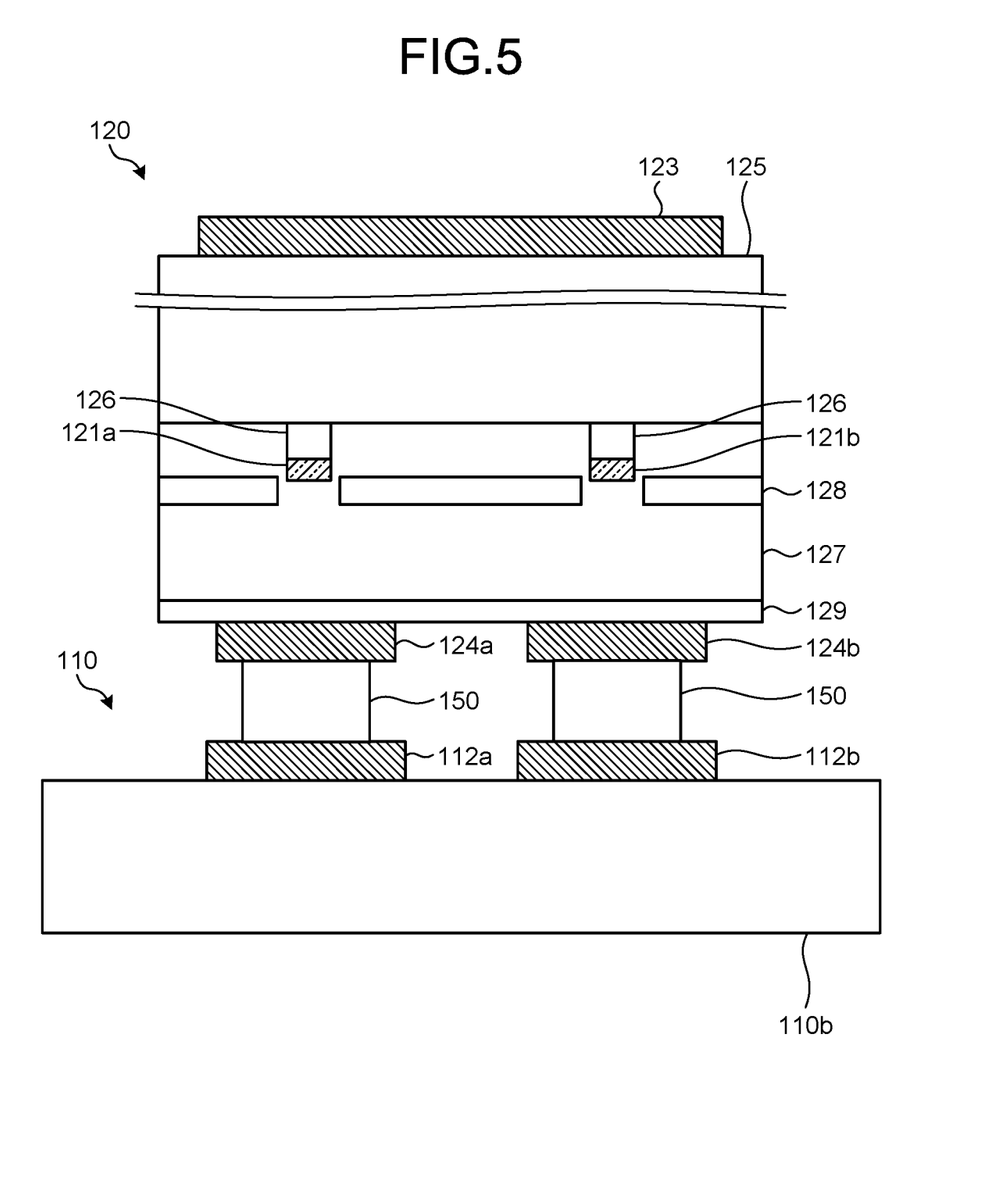
FIG. 5 is a schematic diagram illustrating a cross-section taken along a line II-II in FIG. 1.

Next, a structure of the optical amplifier 100 will be explained, referring further to FIGS. 4 and 5. FIG. 4 is a schematic diagram illustrating a cross-section taken along a line I-I in FIG. 1, and FIG. 5 is a schematic diagram illustrating a cross-section taken along a line II-II in FIG. 1. FIG. 4 illustrates a cross-section at a portion of the U-turn waveguide 122, and FIG. 5 illustrates a cross-section at a portion of the SOAs 121a, 121b.

As illustrated in FIG. 4, on the upper surface of the optical amplifier chip 120, the cathode electrode 123 made using a metal, such as Au (gold), as a material is formed on a substrate 125 in a laminated manner. The substrate 125 is a substrate made from, for example, n-type conductive indium phosphide (n-InP). On the opposite side to the cathode electrode 123 of the substrate 125, an n-type clad layer 126, the U-turn-waveguide core layer 122, and a p-type clad layer 127 are formed. The n-type clad layer 126 and the p-type clad layer 127 use, for example, n-InP and p-InP as their material, respectively.

The U-turn-waveguide core layer 122 has an InGaAsP layer in which a bandgap wavelength is adjusted to be about 1.3 µm so that an absorption coefficient becomes small, for example, in a 1.55 µm waveband. While an upper surface and a lower surface of the U-turn-waveguide core layer 122 are in contact with the n-type clad layer 126 and the p-type clad layer 127, side surfaces are not buried in a semiconductor layer. That is, the U-turn waveguide 122 is a waveguide in a high mesa structure.

Because the U-turn waveguide 122 has the high mesa structure, it is possible to enhance confinement of light to the core layer, and to suppress an optical loss even if the waveguide is sharply bent. As a result, it is possible to make a curvature radius of the U-turn waveguide 122 small to arrange the SOAs 121a, 121b in proximity, to thereby downsize the optical amplifier chip 120.

Below the U-turn waveguide 122, the parallel portions 112a, 112b of the metal wiring 112 formed on the silicon layer 110b of the base substrate 110 are formed. A height from an upper surface of the silicon layer 110b to the U-turn waveguide 122 is, for example, approximately 3 µm to 4 µm. Moreover, a height from the U-turn waveguide 122 to an upper surface of the substrate 125 is, for example, approximately 150 µm. Thus, because the substrate 125 is relatively thick, by mounting the optical amplifier chip 120 on the base substrate 110 positioning the substrate 125 upward, the height from the upper surface of the silicon layer 110b to the SOAs 121a, 121b, the U-turn waveguide 122, and the waveguides 111a, 111b can be made small. As a result, a depth from the upper surface of the base substrate 110 to the bottom surface of the terrace portion 110a can be made small.

As illustrated in FIG. 5, also in a portion of the SOAs 121a, 121b, on the upper surface of the optical amplifier chip 120, the cathode electrode 123 is formed on the substrate 125 in a laminated manner. On a surface opposite to the cathode electrode 123 of the substrate 125, the n-type clad layer 126, the SOA active layers 121a, 121b, the p-type clad layer 127, an n-type current block layer 128, and a contact layer 129 are formed. The n-type clad layer 126, the p-type clad layer 127, the n-type current block layer 128, and the contact layer 129 are made using, for example, n-InP and p-InP as materials, respectively.

The SOA active layers 121a, 121b are active layers of the InGaAsP multiple quantum well structure in which composition is adjusted such that a gain is obtained in, for example, 1.55 µm waveband. Side surfaces of the SOA active layers 121a, 121b are buried in the p-type current block layer, the material of which is, for example, p-InP. That is, the SOAs 121a, 121b are buried waveguide SOA.

On a lower surface of the contact layer 129, the anode electrodes 124a, 124b that are electrically independent from each other are formed at positions corresponding to the SOAs 121a, 121b, respectively. The anode electrodes 124a, 124b are connected to the parallel portions 112a, 112b of the metal wiring 112 formed in the silicon layer 110b of the base substrate 110 through the bumps 150, respectively. Because the parallel portions 112a, 112b are connected by the connecting portion 112c, in a state in which the optical amplifier chip 120 is mounted on the base substrate 110, the anode electrodes 124a, 124b are electrically shorted, to be a single electrode shared by the SOAs 121a, 121b. As a result, the SOAs 121a, 121b can be driven by a single power source, and the control of the optical amplifier chip 20 can be simplified.

Figure 6:
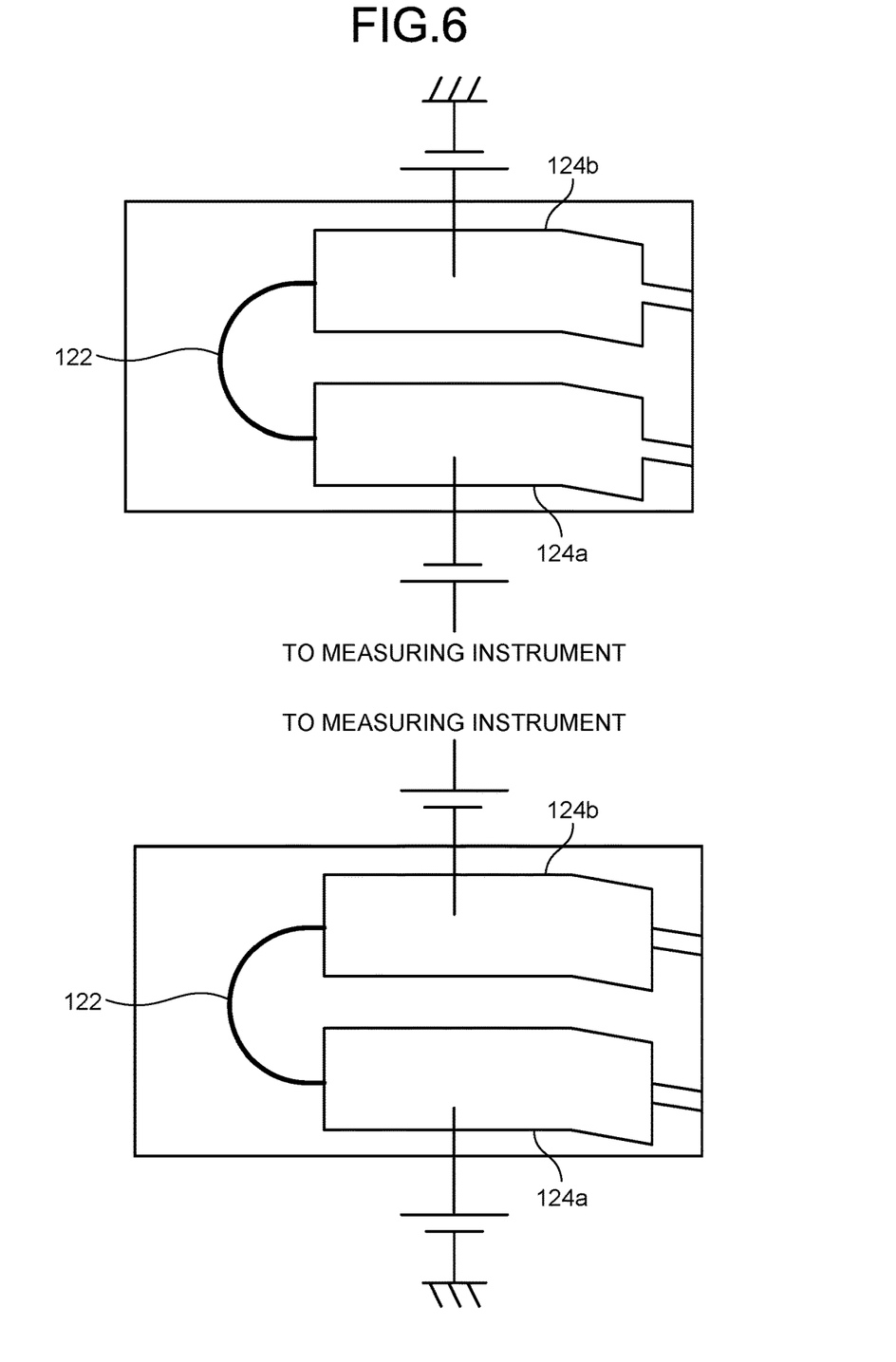
FIG. 6 is a diagram for explaining an inspection method of an optical amplifier chip according to one embodiment.

Next, an inspection method to evaluate properties of the optical amplifier chip 120 will be explained. Before the optical amplifier chip 120 is mounted on the base substrate 110, the anode electrodes 124a, 124b corresponding to the SOAs 121a, 121b are electrically independent from each other. Therefore, by applying different voltages to the anode electrodes 124a, 124b, respectively, properties of the SOAs 121a, 121b can be evaluated.

Specifically, for example, as illustrated in an upper diagram in FIG. 6, a forward current is flown to a pn junction of the SOA 121b by applying a positive voltage to the anode electrode 124b, to let the SOA 121b output an amplified spontaneous emission light (ASE light). Furthermore, a reverse bias is applied to a pn junction of the SOA 121a by applying a negative voltage to the anode electrode 124a, to let it absorb light reaching the SOA 121a from the SOA 121b through the U-turn waveguide 122. Thus, in the SOA 121a, an optical current is generated in proportion to the intensity of the ASE light output from the SOA 121b. The optical current generated in the SOA 121a is measured by a measuring instrument connected to the anode electrode 124a, to measure the intensity of the ASE light output from the SOA 121b, and it is thereby enabled to evaluate properties of the SOA 121b.

On the other hand, when properties of the SOA 121a are evaluated, for example, as illustrated in a lower diagram in FIG. 6, a forward current is flown to a pn junction of the SOA 121a by applying a positive voltage to the anode electrode 124a, to let the SOA 121a output ASE light. Furthermore, a reverse bias is applied to a pn junction of the SOA 121b by applying a negative voltage to the anode electrode 124b, to let it absorb light reaching the SOA 121b from the SOA 121a through the U-turn waveguide 122. Thus, in the SOA 121b, an optical current is generated in proportion to the intensity of the ASE light output from the SOA 121a. The optical current generated in the SOA 121b is measured by a measuring instrument connected to the anode electrode 124a, to measure the intensity of the ASE light output from the SOA 121*a*, and it is thereby enabled to evaluate properties of the SOA 121*a*.

By applying such an inspection method, because the end surfaces of the SOAs 121*a*, 121*b* are not needed to be brought close to each other, evaluation of properties of the optical amplifier chip 120 can be easily performed.

Furthermore, as another inspection method, there is a method in which an optical fiber is brought close to only one of the end surfaces of the SOAs 121*a*, 121*b* to be optically coupled therewith. Specifically, similarly to the above inspection method, a forward current is flown to the pn junction of either one of the SOAs 121*a*, 121*b*, and a reverse bias is applied to the pn junction of the other one. Light is then input by an optical fiber or the like to the end surface of one of the SOAs through which the forward current flows, and an optical current generated in the other SOA as a photo diode (PD) with the reverse bias applied is measured.

When this method is used, the intensity of light input to the other SOA acting as a PD is an intensity of light that is input to one of the SOAs by an optical fiber or the like and amplified by this SOA. Therefore, the optical current generated in the other one of the SOAs is proportional to an amplification factor of one of the SOAs, and a gain of one of the SOAs can be evaluated.

By applying such an inspection method, it is only necessary to bring an optical fiber close to one of SOAs on an input side. Accordingly, the difficulty of bringing optical fibers to end surfaces of both an input and an output of a SOA to optically couple them is eliminated, and a gain of the SOAs 121*a*, 121*b* can be evaluated easily.

By the inspection methods as described above, properties of the optical amplifier chip 120 before mounted on the base substrate 110 can be evaluated efficiently. Furthermore, favorable optical amplification properties of the optical amplifier 100 having a structure in which the optical amplifier chip 120 is mounted on the base substrate 110 can be guaranteed.

Because the optical amplifier chip 120 according to the present embodiment has a structure in which the two SOAs 121*a*, 121*b* are connected by the U-turn waveguide 122, an amount of stray light input to the SOA, an optical current of which is measured is small, compared to a structure in which multiple SOAs are arranged linearly. Therefore, original properties of an SOA on an input side can be evaluated. Moreover, generally, when multiple SOAs are integrated monolithically, minute crosstalk can be generated between the SOAs. However, in the present embodiment, because the U-turn waveguide having a sufficient length is arranged between the SOAs 121*a*, 121*b*, electrical crosstalk can be reduced. As a result, an optical current generated in the SOAs 121*a*, 121*b* can be accurately measured, and properties of the optical amplifier chip 120 can be accurately evaluated.

As described above, according to the present embodiment, two electrically independent anode electrodes are formed at a position corresponding to respective SOAs of an optical amplifier chip that has a structure in which the two SOAs are connected by a U-turn waveguide. Furthermore, by mounting an optical amplifier chip on a base substrate having one common metal wiring that connects the two anode electrodes, an optical amplifier is structured. Therefore, before the optical amplifier chip is mounted on the base substrate, properties of the SOAs can be evaluated by applying a voltage independently to the respective node electrodes of the optical amplifier chip, and by detecting light output from one of the SOAs at the other one of the SOA. In other words, it is not necessary to bring optical fibers or the like close to end surfaces of the two SOAs at the same time, and the optical amplifier chip can be efficiently evaluated, to guarantee favorable optical amplification properties.

Moreover, after the optical amplifier chip is mounted on the base substrate, because a common voltage can be applied to the two anode electrodes through the metal wiring on the base substrate, the control of the optical amplifier chip can be simplified during operation of the optical amplifier.

In the embodiment described above, the metal wiring 112 of the base substrate 110 has a U-shape, but the shape of the metal wiring is not limited to a U-shape. That is, as long as it is a single piece of common metal wiring that connects the anode electrodes 124*a*, 124*b* of the optical amplifier chip 120, it may be a metal wiring, for example, in a rectangular shape, an oval shape, or the like.

Moreover, in the embodiment described above, it has been explained that the side surfaces of the core layer of the U-turn waveguide 122 of the optical amplifier chip 120 are not buried in the semiconductor layer, and gaps are generated. However, on the side surfaces of the core layer and around the clad layer of the U-turn waveguide 122, for example, insulating resin or the like may be filled. As resin is filled in the gap around the U-turn waveguide 122, the rigidity of the optical amplifier chip 120 can be improved.

Materials of a semiconductor and a conductive material forming the base substrate 110 and the optical amplifier chip 120 are not limited to the ones described as an example in the above embodiment.

According to one mode of an optical amplifier and an inspection method of an optical amplifier disclosed in the present application, an effect that an optical amplifier chip can be efficiently evaluated, and favorable optical amplification properties can be guaranteed is produced.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical amplifier comprising:
    an optical amplifier chip formed on a first substrate that includes a pair of semiconductor optical amplifiers (SOAs), a U-shaped waveguide connecting the pair of SOAs, and two electrodes that respectively correspond to the pair of SOAs and are separated from each other; and
    a second substrate that includes a common metal wiring connecting the two electrodes, and on which the optical amplifier chip is mounted.

2. The optical amplifier according to claim 1, wherein the second substrate includes
    a silicon layer;
    a first insulating layer that is laminated on the silicon layer;
    a waveguide layer that is formed on the first insulating layer and is made from silicon; and
    a second insulating layer that covers the waveguide layer.

3. The optical amplifier according to claim 2, wherein
the second substrate includes a terrace portion that is formed by cutting out at least the first insulating layer, the waveguide layer, and the second insulating layer, and
the optical amplifier chip is mounted on the terrace portion.

4. The optical amplifier according to claim 2, wherein
the pair of SOAs have a side surface that is optically coupled with a side surface of the waveguide layer.

5. The optical amplifier according to claim 1, wherein
the pair of SOAs are driven by a single power source through the pair of electrodes and the metal wiring.

\* \* \* \* \*